United States Patent
Yoshimatsu et al.

(10) Patent No.: US 7,176,500 B2
(45) Date of Patent: Feb. 13, 2007

(54) RED FLUORESCENT MATERIAL, WHITE LIGHT EMITTING DIODE USING RED FLUORESCENT MATERIAL, AND LIGHTING SYSTEM USING WHITE LIGHT EMITTING DIODE

(75) Inventors: Ryo Yoshimatsu, Shinagawa-ku (JP); Hisashi Yoshida, Shinagawa-ku (JP)

(73) Assignee: NEC Corporation, Tokyo (JP)

( * ) Notice: Subject to any disclaimer, the term of this patent is extended or adjusted under 35 U.S.C. 154(b) by 136 days.

(21) Appl. No.: 11/013,341

(22) Filed: Dec. 17, 2004

(65) Prior Publication Data

US 2005/0133805 A1    Jun. 23, 2005

(30) Foreign Application Priority Data

Dec. 19, 2003    (JP)    ............................. 2003-422764

(51) Int. Cl.
*H01L 33/00*    (2006.01)
(52) U.S. Cl. .................. 257/98; 257/100; 313/502; 313/503
(58) Field of Classification Search .................. 257/98, 257/100; 313/502, 503
See application file for complete search history.

(56) References Cited

U.S. PATENT DOCUMENTS 6,576,931 B2 *    6/2003    Furukawa et al. ............. 257/98
6,747,293 B2 *    6/2004    Nitta et al. .................... 257/99
7,026,755 B2 *    4/2006    Setlur et al. ................. 313/501

FOREIGN PATENT DOCUMENTS

| JP | H11-046015 A | 2/1999 |
| JP | 2900928 B2 | 3/1999 |
| JP | 2927279 B2 | 5/1999 |
| JP | 2998696 B2 | 11/1999 |
| JP | 2000-509912 A | 8/2000 |
| JP | 2002-299691 A | 10/2002 |

* cited by examiner

*Primary Examiner*—Gene M. Munson
(74) *Attorney, Agent, or Firm*—Sughrue Mion, PLLC

(57) ABSTRACT

The present invention achieves improvement of the color reproducibility, color rendering properties and light emitting efficiency of a white light emitting diode. The present invention is a red fluorescent material composed of a europium doped lithium lanthanum niobate represented by a general formula of $LiLa_{1-x}Eu_xNb_2O_7$ ($0<x \leq 1$). The red fluorescent material can efficiently converts light in the light emission wavelength range from 350 to 410 nm of an ultraviolet light emitting diode into red light, and can efficiently converts blue light at 465 nm and green light at 538 nm into red light.

13 Claims, 2 Drawing Sheets

RED FLUORESCENT MATERIAL, WHITE LIGHT EMITTING DIODE USING RED FLUORESCENT MATERIAL, AND LIGHTING SYSTEM USING WHITE LIGHT EMITTING DIODE

BACKGROUND OF THE INVENTION

1. Field of the Invention

The present invention relates to a red fluorescent material; a white light emitting diode using the red fluorescent material; a lighting device, a light emitting diode display, and a backlight unit for a liquid crystal display, these devices and unit using the white light emitting diode; and a liquid crystal display using the backlight unit.

2. Description of the Related Art

Light emitting diodes are different in light emitting mechanism from currently used light fixtures such as incandescent bulbs and fluorescent bulbs, and are compact and bright; the electric power consumption of light emitting diodes is about one-eighth the electric power consumption of bulbs having the same brightness and about one-half the electric power consumption of fluorescent lamps having the same brightness, and thus, light emitting diodes have properties excellent in energy saving. Additionally, light emitting diodes are long in operation life, excellent in shock resistance, compact and lightweight, free from yielding such harmful wastes as derived from conventional light sources, and accordingly can be used as excellent light sources in harmony with the environment.

As white light emitting diodes, known are those disclosed in Japanese Patent Nos. 2900928, 2998696, 2927279, etc. which use: light emitting diodes using nitride semiconductors and emitting blue or blue-green light; and a fluorescent material in which Ce is doped in a YAG based oxide matrix lattice (YAG:Ce fluorescent material, hereinafter abbreviated as YAG based yellow fluorescent material) known by a composition formula of $(Y,Gd)_3(Al,Ga)_5O_{12}$, the fluorescent material being excited by the blue or blue-green light emission of the above described light emitting diodes to emit yellow fluorescence to be complementary to the light emission of the light emitting diodes. In white light emitting diodes of this type, fluorescent materials are dispersed in the sealing resin portion enclosing each light emitting diode. Additionally, Japanese Patent Laid-Open No. 11-46015 discloses a white light emitting diode in which a non-particulate fluorescent material layer is formed as a film on a blue light emitting diode.

Additionally, National Publication of International Patent Application No. 2000-509912 discloses a three-wavelength type white light emitting diode in which are combined three ultraviolet light emitting fluorescent materials respectively emitting red light (590 nm to 630 nm), green light (520 nm to 570 nm) and blue light (430 nm to 490 nm) caused by an ultraviolet light emitting diode emitting short wavelength near ultraviolet light (370 to 410 nm). The white light emitting diode includes an ultraviolet light emitting diode disposed inside a transparent resin portion formed in a dome shape on a transparent substrate (a front panel). In the transparent resin portion are admixed three types of fluorescent material powders respectively emitting red, green and blue light caused by ultraviolet light. The surface of the transparent resin portion is subjected to mirror finish so as to work as a mirror.

National Publication of International Patent Application No. 2000-509912 discloses $Y_2O_2S:Eu^{3+}$ as a red light emitting fluorescent material with an ultraviolet emitting diode composed of InGaN or GaN as exciting light source.

These white light emitting diodes are low in electric power consumption and long in operation life, and hence have began to be used in the fields of lighting systems, displays, liquid crystal display and the like.

White light emitting diodes, using the blue or blue-green light emission and yellow fluorescence complementary to the blue or blue-green light emission, are used for backlight units of liquid crystal display and for light emitting diode displays. However, the white light emitting diodes having such structures as described above are poor in color reproducibility and color rendering properties because of insufficient light emitting intensity in the red region; thus, improvement of these problems have been demanded.

Additionally, a white light emitting diode using an ultraviolet light emitting diode, disclosed in National Publication of International Patent Application No. 2000-509912, has a high light emission efficiency in the light emission wavelengths from 370 nm to 410 nm of the ultraviolet light emitting diode, and particularly, has a highest light emission efficiency at wavelengths around 390 nm. On the contrary, a red light emitting fluorescent material of $Y_2O_2S:Eu_{+3}$ efficiently absorbs light of 370 nm wavelength, and hence the light emission efficiency is not sufficient when an ultraviolet light emitting diode is used as an excitation source; thus, demanded is a material which can be an ultraviolet light emitting diode for the wavelength around 390 nm and has a further higher light emitting efficiency.

SUMMARY OF THE INVENTION

The present invention is a red fluorescent material including a europium doped lithium lanthanum niobate represented by a general formula of $LiLa_{1-x}Eu_xNb_2O_7$ ($0<x\leq1$).

The present invention is a white light emitting diode comprising an ultraviolet light emitting diode emitting ultraviolet light, and a blue fluorescent material, a green fluorescent material and a red fluorescent material, respectively emitting blue, green and red fluorescence, and disposed at least in an area which is irradiated with said ultraviolet light and a portion of the light emitting surface of the ultraviolet light emitting diode to emit white light through the blue, green and red fluorescence, wherein the red fluorescent material is composed of the red fluorescent material comprising the europium doped lithium lanthanum niobate represented by the general formula of $LiLa_{1-x}Eu_xNb_2O_7$ ($0<x\leq1$).

Additionally, the present invention is a white light emitting diode comprising a light emitting diode emitting light in any of the wavelength regions ranging at least from blue to green light; a yellow fluorescent material in which Ce is doped in a YAG based oxide matrix lattice, known by a composition formula of $(Y,Gd)_3(Al,Ga)_5O_{12}$, and emits yellow light, caused by and complementary to the above described diode-emitted light; and a red fluorescent material emitting red light, wherein the yellow fluorescent material and the red fluorescent material are disposed at least in an area which is irradiated with the light emission from said light emitting diode and a portion of the light emitting surface of said light emitting diode. Additionally, it is preferable that the red fluorescent material emits red light upon receiving yellow fluorescence, and in this case, it is more preferable that the yellow fluorescent material is a YAG based yellow fluorescent material. It is preferable that the red fluorescent material is the red fluorescent material composed of the europium doped lithium lanthanum niobate represented by the general formula of $LiLa_{1-x}Eu_xNb_2O_7$ ($0<x\leq1$).

The light emitting diode of the present invention further can be used for lighting devices, light emitting diode display devices, and backlight units of liquid crystal display devices, all being characterized by the use of a white light emitting diode, and relates to liquid crystal display devices using the backlight units.

The red fluorescent material of the present invention is excited by the light wavelength region of an ultraviolet light emitting diode, and also is excited by the light emission region of a light emitting diode emitting blue or green light, and emits red light in high efficiency.

Consequently, when the red fluorescent material of the present invention is used as the red fluorescent material of a white light emitting diode using an ultraviolet light emitting diode, a white light emitting diode emitting light in a high efficiency can be obtained.

Additionally, by using the red fluorescent material of the present invention in a manner admixed in a white light emitting diode including a blue or green light emitting diode and a fluorescent material which is excited by the light emitted by a blue or green light emitting diode to emit yellow light to be complementary to the light emitted by the blue or green light emitting diode, a red component can be added to the yellow light to be complementary to the light emitted by the blue or green light emitting diode, and consequently, there can be obtained a white light emitting diode which is excellent in color reproducibility and is improved in color rendering property.

DETAILED DESCRIPTION OF THE INVENTION AND PREFERRED EMBODIMENTS

The present inventors, as a result of an elaborate research and development of a red fluorescent material, discovered a red fluorescent material composed of a europium doped lithium lanthanum niobate, formed in combination of the elements of Li, La, Eu, Nb and O, and represented by a general formula of $LiLa_{1-x}Eu_xNb_2O_7$ ($0<x\leq1$).

A first embodiment is the red fluorescent material of the present invention.

Figure 1:
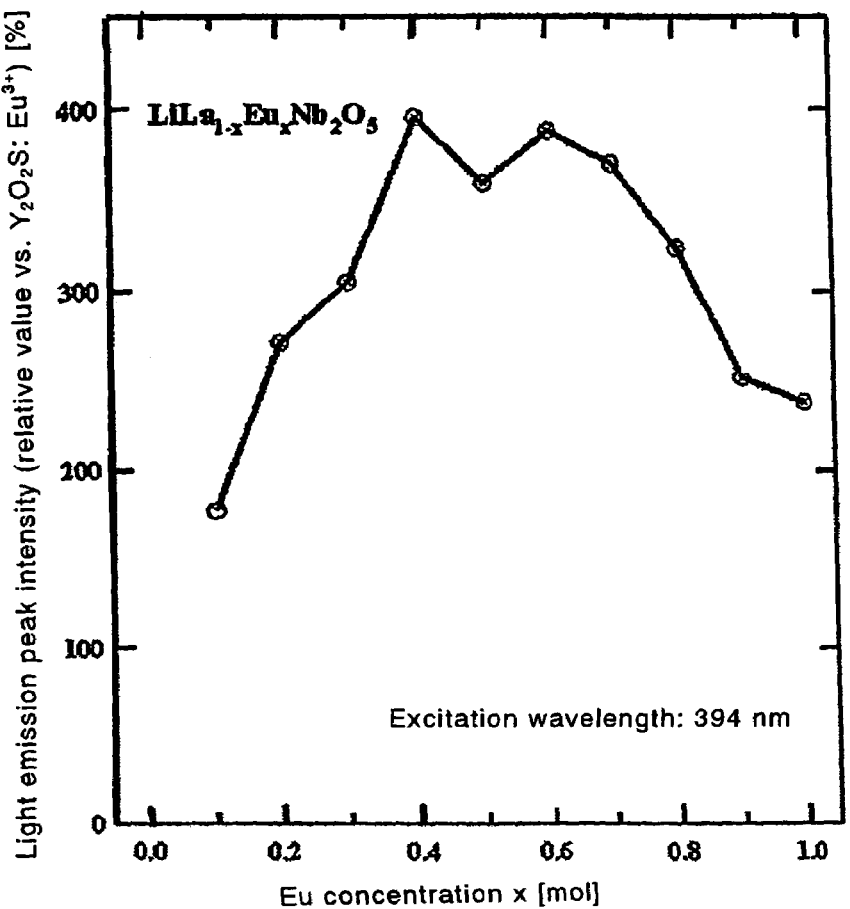
[FIG. 1] Eu concentration dependence in $LiLa_{1-x}Eu_xNb_2O_7$ (relative values of light emission peak intensity with respect to $Y_2O_2S:Eu^{3+}$; excitation wavelength: 394 nm).

The red fluorescent material of the present invention composed of the europium doped lithium lanthanum niobate, represented by the general formula of $LiLa_{1-x}Eu_xNb_2O_7$ ($0<x\leq1$), can yield a high light emission intensity in a red region around 610 nm by a near ultraviolet excitation light, in particular, an excitation light around 390 nm, as shown in FIG. 1 and Table 1. As shown by the light emission peak intensity in FIG. 1, the light emission intensity depends on the concentration of Eu, namely, x.

Figure 2:
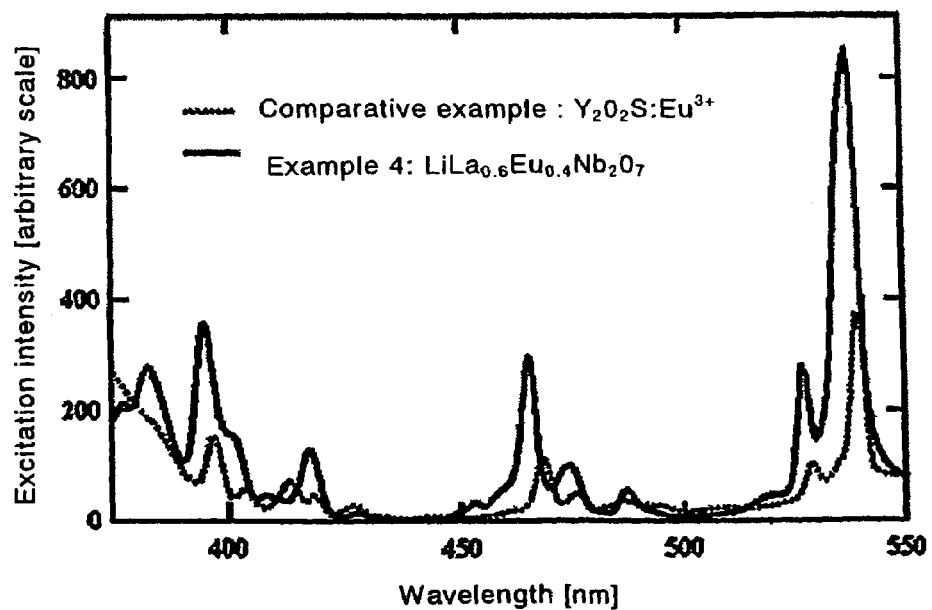
[FIG. 2] Comparison between the excitation spectra of $Y_2O_2S:Eu^{3+}$ (Comparative Example) and $LiLa_{0.6}Eu_{0.4}Nb_2O_7$ (Example 4).

Additionally, from the excitation spectra of Example 4 ($LiLa_{1-0.4}Eu_{0.4}Nb_2O_7$) and Comparative Example of $Y_2O_2S:Eu^{3+}$, shown in FIG. 2, the red fluorescent material of the present invention composed of the europium doped lithium lanthanum niobate, represented by the general formula of $LiLa_{1-x}Eu_xNb_2O_7$ ($0<x\leq1$), is shown to efficiently convert blue light and blue-green light into red light in the blue light and the blue-green light regions respectively around at 465 nm and 538 nm, as compared to Comparative Example of $Y_2O_2S:Eu^{3+}$. Furthermore, it can be seen that the red fluorescent material efficiently convert the ultraviolet light into red light and wavelength region of the light emission of the ultraviolet light emitting diode from 350 to 410 nm, in particular, at around 390 nm.

Figure 3:
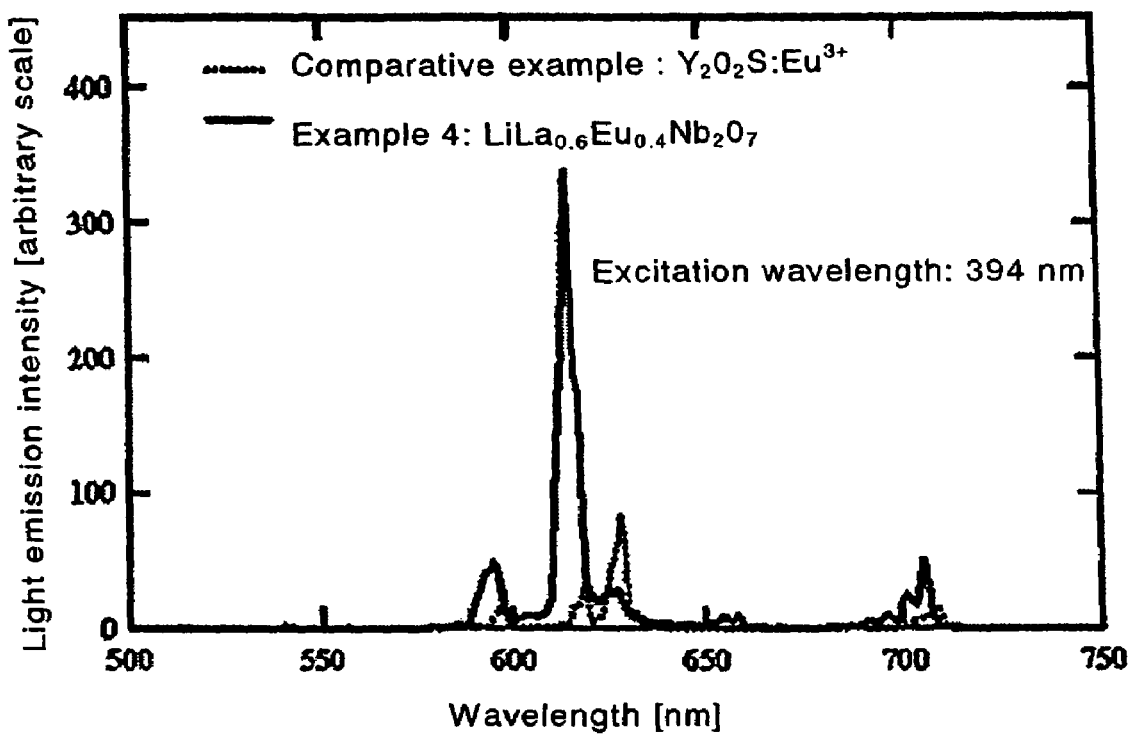
[FIG. 3] Comparison between the light emission spectra of $Y_2O_2S:Eu^{3+}$ (Comparative Example) and $LiLa_{0.6}Eu_{0.4}Nb_2O_7$ (Example 4).

As shown in FIG. 3, in excitation at 394 nm, Example 4 ($LiLa_{1-0.4}Eu_{0.4}Nb_2O_7$) shows the light emission peak intensity of about 400% of the light emission peak intensity of Comparative Example ($y_2O_2S:Eu^{3+}$).

The red fluorescent material of the present invention composed of the europium doped lithium lanthanum niobate, represented by the general formula of $LiLa_{1-x}Eu_xNb_2O_7$ ($0<x\leq1$), can achieve the effect of the present invention with the Eu concentration of $0<x\leq1$, preferably $0.1<x\leq0.9$, more preferably $0.2<x\leq0.8$.

The red fluorescent material of the present invention composed of the europium doped lithium lanthanum niobate, represented by the general formula of $LiLa_{1-x}Eu_xNb_2O_7$ ($0<x\leq1$) emits red light having a high visibility, and can thereby find an advantage such that there is exhibited a relatively high luminance in comparison with the light emission peak intensity. Consequently, the use of the red fluorescent material of the present invention as the red fluorescent material in a white light emitting element makes it possible to further improve the efficiency.

A second embodiment is an article in which a fluorescent material in which Ce is doped in a YAG based oxide matrix lattice (YAG:Ce fluorescent material), known by a composition formula of $(Y,Gd)_3(Al,Ga)_5O_{12}$, emitting yellow light to be complementary to blue and green light, and the red fluorescent material of the present invention composed of the europium doped lithium lanthanum niobate, represented by the general formula of $LiLa_{1-x}Eu_xNb_2O_7$ ($0<x\leq1$), are dispersed in the sealing resin portion enclosing a blue light emitting diode using a nitride semiconductor.

The red fluorescent material of the present invention composed of the europium doped lithium lanthanum niobate, represented by the general formula of $LiLa_{1-x}Eu_xNb_2O_7$ ($0<x\leq1$) efficiently converts blue light at around 465 nm and green light at around 538 nm into red light, as shown by the excitation spectrum in FIG. 2.

Additionally, the YAG based yellow fluorescent material emits nearly yellow light (the wavelength: 590 nm), and emits light over a broad wavelength range, so that the red fluorescent material of the present invention composed of the europium doped lithium lanthanum niobate, represented by the general formula of $LiLa_{1-x}Eu_xNb_2O_7$ ($0<x\leq1$) emits red light by receiving the fluorescence from the YAG based yellow fluorescent material in addition to the light emitted from a blue light emitting diode. Consequently, there can be overcome problems of the conventional technique, namely, poor color reproducibility and low color rendering properties caused by insufficient light emitting intensity.

A third embodiment of the present invention is an article in which an ultraviolet light emitting diode is disposed inside a transparent resin portion formed on a transparent substrate (a front panel), and the red fluorescent material of the present invention is used in the red fluorescent material of a three-wavelength type white light emitting diode in which three visible light emitting fluorescent materials respectively emitting red light, green light and blue light caused by ultraviolet light are mixed in the transparent resin portion. The conventional $Y_2O_2S:Eu^{3+}$ red fluorescent material has a problem such that the light emission efficiency is low; wherein receiving the wavelength range around 390 nm where an ultraviolet light emitting diode emits light efficiently; however, the red fluorescent material of the present invention composed of the europium doped calcium lanthanum tungstate, represented by the general formula of $LiLa_{1-x}Eu_xNb_2O_7$ ($0<x\leq1$), emits light efficiently wherein receiving the wavelength range around 390 nm where a ultraviolet light emitting diode emits light efficiently, as shown in FIG. 1, Table 1 and FIG. 3.

Additionally, the YAG based yellow fluorescent material emits nearly yellow light (the wavelength: 590 nm), and emits light over a broad wavelength range, so that by the use of the red fluorescent material of the present invention composed of the europium doped lithium lanthanum niobate, represented by the general formula of $LiLa_{1-x}Eu_xNb_2O_7$ ($0<x\leq1$), a white light emitting diode satisfactory in color reproducibility, high in color rendering property and high in light emission efficiency is obtained.

The white light emitting diode satisfactory in color reducibility, high in color rendering properties and high in light emission efficiency can be used for lighting devices, light emitting diode display devices, backlight units of liquid crystal display devices and the like.

EXAMPLES

Detailed description will be made on the red fluorescent material of the present invention composed of the europium doped lithium lanthanum niobate, formed in combination of the elements of Li, La, Eu, Nb and O, and represented by the general formula of $LiLa_{1-x}Eu_xNb_2O_7$ ($0<x\leq1$).

(Description of the Fabrication Methods of Examples)

Next, description will be made on the fabrication methods of Examples.

At the beginning, as the raw materials for synthesis of the fluorescent materials, there are used lithium compounds such as lithium carbonate ($Li_2CO_3$), lanthanum compounds such as lanthanum oxide ($La_2O_3$), europium compounds such as europium oxide ($Eu_2O_3$) and niobium compounds such as niobium oxide ($Nb_2O_5$). These raw materials are weighed out according to the composition formula, collected and mixed together fully by a wet or dry method.

The mixture thus obtained is charged in a heat resistant vessel such as an alumina crucible and a platinum crucible, calcined in the air at 1100 to 1300° C. for 3 to 10 hours; the calcined substance thus obtained is pulverized, washed, dried and sieved out, and thus the fluorescent material of the present invention is obtained. Incidentally, calcination may be conducted at 800 to 1000° C., before calcination, as preliminary calcination. Additionally, if the sample obtained is insufficient in calcination, recalcination and the like may be conducted. It is preferable that preliminary calcination and calcination, or recalcination is calcination conducted in an oxidative atmosphere.

Table 1 shows the compositions and the light emission properties, and in Example 4, an example fabricated in the present invention is described. As the raw materials, powders of $Li_2CO_3$, $La_2O_3$, $Eu_2O_3$ and $Nb_2O_5$ were used and weighed out. The respective raw materials weighed out were as follows: $Li_2CO_3$=2.0000 g, $Nb_2O_5$=14.3900 g, $La_2O_3$=5.2915 g, $Eu_2O_3$=3.8102 g; these were placed in an alumina mortar and mixed fully with an alumina pestle in a dry mixing operation. The mixed powder was charged in an alumina crucible, the crucible was set in an electric furnace for calcination in the air at 1220° C. for 6 hours. After calcination, the crucible was cooled slowly, and the calcined substance thus obtained was subjected to pulverization, washing with water, sieving out and the like, and thus the desired sample was obtained.

TABLE 1

Comparison of light emission properties under the excitation at 394 nm between $Y_2O_2S:Eu^{3+}$ (Comparative Example) and $LiLa_{1-x}Eu_xNb_2O_7$ (Examples 1 to 10)

| | | Light emission peak intensity [%] | Tristimulus values in XYZ color system | |
|---|---|---|---|---|
| | Composition | | X[%] | Y[%] |
| Comparative example | $Y_2O_2S:Eu^{3+}$ | 100.0 | 100.0 | 100.0 |
| Example 1 | $LiLa_{0.9}Eu_{0.1}Nb_2O_7$ | 177.8 | 204.0 | 204.5 |
| Example 2 | $LiLa_{0.8}Eu_{0.2}Nb_2O_7$ | 272.2 | 306.4 | 294.4 |
| Example 3 | $LiLa_{0.7}Eu_{0.3}Nb_2O_7$ | 305.7 | 341.9 | 324.6 |
| Example 4 | $LiLa_{0.6}Eu_{0.4}Nb_2O_7$ | 395.7 | 442.6 | 417.5 |
| Example 5 | $LiLa_{0.5}Eu_{0.5}Nb_2O_7$ | 360.3 | 399.0 | 376.7 |
| Example 6 | $LiLa_{0.4}Eu_{0.6}Nb_2O_7$ | 388.3 | 425.2 | 400.7 |
| Example 7 | $LiLa_{0.3}Eu_{0.7}Nb_2O_7$ | 370.6 | 405.7 | 381.9 |
| Example 8 | $LiLa_{0.2}Eu_{0.8}Nb_2O_7$ | 324.3 | 349.8 | 329.5 |
| Example 9 | $LiLa_{0.1}Eu_{0.9}Nb_2O_7$ | 252.6 | 270.6 | 255.7 |
| Example 10 | $LiEuNb_2O_7$ ($LiLa_{0.0}Eu_{1.0}Nb_2O_7$) | 238.8 | 247.0 | 232.8 |

What is claimed is:

1. A red fluorescent material comprising a europium doped lithium lanthanum niobate represented by a general formula of $LiLa_{1-x}Eu_xNb_2O_7$ ($0<x\leq1$).

2. A white light emitting diode comprising:
   an ultraviolet light emitting diode emitting ultraviolet light; and
   a blue fluorescent material, a green fluorescent material and a red fluorescent material, respectively emitting blue, green and red fluorescence, and disposed at least in an area which is irradiated with said ultraviolet light and a portion of the light emitting surface of said ultraviolet light emitting diode to emit white light owing to said blue, green and red fluorescence,
   wherein said red fluorescent material is composed of the red fluorescent material comprising a europium doped lithium lanthanum niobate represented by a general formula of $LiLa_{1-x}Eu_xNb_2O_7$ ($0<x\leq1$).

3. A lighting device using the white light emitting diode according to claim 2.

4. A light emitting diode display device using the white light emitting diode according to claim 2.

5. A backlight unit of a liquid crystal display device, wherein the white light emitting diode according to claim 2 is used.

6. A liquid crystal display device using the back light unit according to claim 5.

7. A white light emitting diode, wherein the white light emitting diode comprises:
   a light emitting diode emitting light in any of the wavelength regions ranging at least from blue to green light;
   a yellow fluorescent material in which Ce is doped in a YAG based oxide matrix lattice known by a composition formula of $(Y,Gd)_3(Al,Ga)_{5n}O_{12}$, and emits yellow light caused by and complementary to said diode-emitted light; and a red fluorescent material emitting red light, wherein the yellow fluorescent material and the red fluorescent material are disposed at least in an area which is irradiated with the light emission from said light emitting diode and a portion of the light emitting surface of said light emitting diode.

8. The white light emitting diode according to claim 7, wherein said red fluorescent material receives said yellow fluorescence and emits red light.

9. The white light emitting diode according to claim 7, wherein said red fluorescent material is a red fluorescent material comprising a europium doped lithium lanthanum niobate represented by the general formula of $LiLa_{1-x}Eu_xNb_2O_7$ ($0<x\leqq1$).

10. A lighting device using the white light emitting diode according to claim 7.

11. A light emitting diode display device using the white light emitting diode according to claim 7.

12. A backlight unit of a liquid crystal display device, wherein the white light emitting diode according to claim 7 is used.

13. A liquid crystal display device using the back light unit according to claim 12.

* * * * *